(12) United States Patent
Subramanian

(10) Patent No.: US 6,611,570 B1
(45) Date of Patent: Aug. 26, 2003

(54) PROGRAMMABLE DIGITAL INTERMEDIATE FREQUENCY TRANSCEIVER

(75) Inventor: Ravi Subramanian, Mountain View, CA (US)

(73) Assignee: Morphics Technology, Inc., Campbell, CA (US)

( * ) Notice: Subject to any disclaimer, the term of this patent is extended or adjusted under 35 U.S.C. 154(b) by 0 days.

(21) Appl. No.: 09/565,650

(22) Filed: May 5, 2000

Related U.S. Application Data

(60) Provisional application No. 60/133,136, filed on May 7, 1999.

(51) Int. Cl.[7] ............................................. H04L 27/14
(52) U.S. Cl. ...................................... 375/326; 375/355
(58) Field of Search ................................ 375/354, 355, 375/350, 326, 327, 328

(56) References Cited

U.S. PATENT DOCUMENTS

| | | |
|---|---|---|
| 5,375,146 A | 12/1994 | Chalmers |
| 5,557,642 A | 9/1996 | Williams ..................... 375/316 |
| 5,574,775 A | 11/1996 | Miller, II et al. ............. 379/60 |
| 5,748,047 A | 5/1998 | Guthrie et al. |
| 5,805,108 A | 9/1998 | Lennen |
| 5,812,605 A | 9/1998 | Smith et al. ................. 375/308 |
| 5,818,883 A | 10/1998 | Smith et al. ................. 375/347 |
| 5,819,161 A | 10/1998 | Saito |
| 5,909,193 A | 6/1999 | Phillips et al. .............. 342/410 |
| 6,009,130 A | 12/1999 | Lurey et al. ................. 375/347 |
| 6,055,281 A * | 4/2000 | Hendrickson et al. ....... 329/304 |
| 6,141,372 A * | 10/2000 | Chalmers .................... 375/147 |

FOREIGN PATENT DOCUMENTS

| | | |
|---|---|---|
| WO | WO93/25968 A1 | 12/1993 |
| WO | WO98/23071 | 5/1998 |

* cited by examiner

*Primary Examiner*—Don N. Vo
(74) *Attorney, Agent, or Firm*—Darby & Darby

(57) ABSTRACT

A monolithic CMOS programmable digital intermediate frequency receiver includes a programmable memory, a clock generator, a sigma delta converter, a digital downconverter, and a decimation filter network. The programmable memory receives and stores a first value representative of a programmable parameter k and a second value representative of programmable parameter N. Coupled to the programmable memory, the clock generator generates a first clock signal, a second clock signal and a third clock signal. The first clock signal has a first frequency, $f_t$, the second clock signal has a second frequency approximately equal to $f_t/k$ and the third clock signal has a third frequency approximately equal to $f_t/N$. The sigma delta converter samples an analog input signal having an intermediate frequency using the first clock signal to generate a first set of digital signals. The digital downconverter mixes down the first set of digital signals using the second clock signal to generate a second set of digital signals. Finally, the decimation filter network filters the second set of digital signals using the third clock signal to generate a third set of digital signals.

5 Claims, 6 Drawing Sheets

PROGRAMMABLE DIGITAL INTERMEDIATE FREQUENCY TRANSCEIVER

CROSS REFERENCE TO RELATED APPLICATION

This application claims priority from the Provisional Application entitled "Programmable Digital Intermediate Frequency Transceiver", U.S. Serial No. 60/133,136, filed May 7, 1999.

BRIEF DESCRIPTION OF THE INVENTION

This invention relates generally to communication devices. More particularly, this invention relates to a programmable, completely digital intermediate frequency transceiver for use in communication systems.

BACKGROUND OF THE INVENTION

Intermediate frequency transceivers have traditionally been implemented as analog devices. Increasingly, growing numbers of functions of intermediate frequency transceivers have been implemented with digital circuits. FIG. 1 illustrates in block diagram form a prior art completely digital intermediate frequency receiver 10, which is commonly referred to as a bandpass digitized receiver. Receiver 10 includes a Flash Analog-to-Digital converter (A/D) 12, which directly digitizes the incoming intermediate frequency input signal. Flash A/D 12 offers the advantages of a large sampling bandwidth and a high spurious-free dynamic range; however these advantages are offset by significant disadvantages. First, Flash A/D 12 is typically realized using a bi-polar CMOS process, rather than the standard digital CMOS processes used to realize Digital Mixer 13 and Digital Filter 14. This difference in CMOS processes prevents realization of Receiver 10 on a single substrate. Second, the amplitude resolution of Flash A/D 12 is limited to about eight bits. Receiver 10 as a whole suffers from another disadvantage. Receiver 10 is designed about specific, fixed frequencies, including intermediate frequency, $F_{IF}$, sampling frequency, $F_s$, and down conversion frequency, $F_M$. Any change in the value of any of these quantities requires a redesign.

Other types of A/Ds have not been deemed suitable alternatives to a Flash A/D in a completely digital IF Transceiver. Sigma-delta modulators are used as A/Ds in audio applications; however, their frequency range is inadequate for use in radio applications. Briefly described, delta modulation is an analog-to-digital conversion process where the output digital code represents the change, or slope, of the analog input signal, rather than the absolute value of the analog input signal. A sigma-delta converter is an oversampling analog-to-digital converter where the analog signal is sampled at rates much higher (e.g., 64 times) than the sampling rates that would be required with a Nyquist converter. Sigma-delta converters integrate the analog signal before performing delta modulation. The integral of the analog signal is encoded rather than the change in the analog signal, as is the case for traditional delta modulation.

The demand for completely digital IF receivers is mirrored by a demand for completely digital IF transmitters. FIG. 6 illustrates in block diagram form a prior art intermediate frequency transmitter 100, which includes Digital-to-Analog Converters (D/A) 104 & 106 and analog Mixer 108. D/A 104 converts the digital In-phase data (I) into an analog I signal, while D/A 106 converts the digital Quadrature data (Q) into an analog Q signal. Analog Mixer 108 mixes the analog I and Q signals using a clock signal $F_M$ to generate the IF output signal. Prior art transmitter 100 suffers from at least three disadvantages. First, transmitter 100 is implemented entirely with analog devices, achieving high performance is expensive. Second, because of its analog circuitry transmitter 100 cannot be realized as a monolithic CMOS device. Finally, transmitter 100 is designed about specific, fixed values of intermediate frequency, $F_{IF}$, and up conversion frequency, $F_M$. Any change in the value of either of these frequencies requires a redesign.

Thus, a need exists for a monolithic, programmable, completely digital intermediate frequency transceiver suited for application in a highly integrated, flexible, low-cost, low power device for communication applications.

SUMMARY OF THE INVENTION

The monolithic CMOS programmable digital intermediate frequency receiver of the present invention includes a programmable memory, a clock generator, a sigma delta converter, a digital downconverter, and a decimation filter network. The programmable memory receives and stores a first value representative of a programmable parameter k and a second value representative of programmable parameter N. Coupled to the programmable memory, the clock generator generates a first clock signal, a second clock signal and a third clock signal. The first clock signal has a first frequency, $f_l$, the second clock signal has a second frequency approximately equal to $f_l/k$ and the third clock signal has a third frequency approximately equal to $f_l/N$. The sigma delta converter samples an analog input signal having an intermediate frequency using the first clock signal to generate a first set of digital signals. The digital downconverter mixes down the first set of digital signals using the second clock signal to generate a second set of digital signals. Finally, the decimation filter network filters the second set of digital signals using the third clock signal to generate a third set of digital signals.

The invention may also be realized as a completely digital, programmable monolithic CMOS IF Transceiver. The completely digital architecture achieves intermediate frequency up-conversion and down-conversion. A combination sigma-delta architecture and polyphase filter is used to achieve the up-conversion and down-conversion.

The invention allows the replacement of expensive analog components with lower-cost CMOS digital circuits. The invention facilitates the use of a single architecture across a wide variety of intermediate frequencies and channel bandwidths. The completely digital path ensures a linear transmit and receive path.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

A. The IF Receiver

Figure 1:
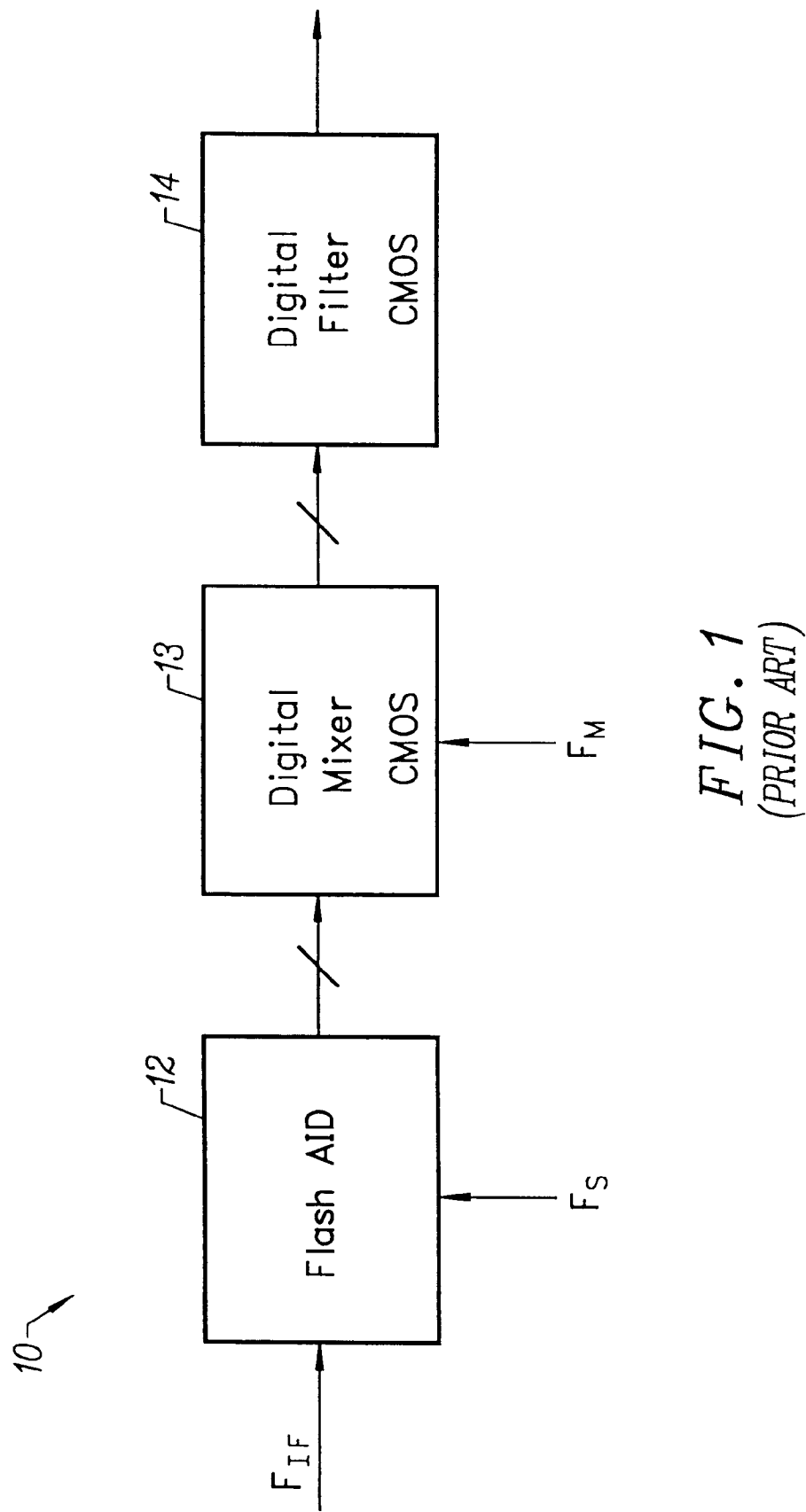
FIG. 1 illustrates a prior art completely digital intermediate frequency receiver.
Figure 2:
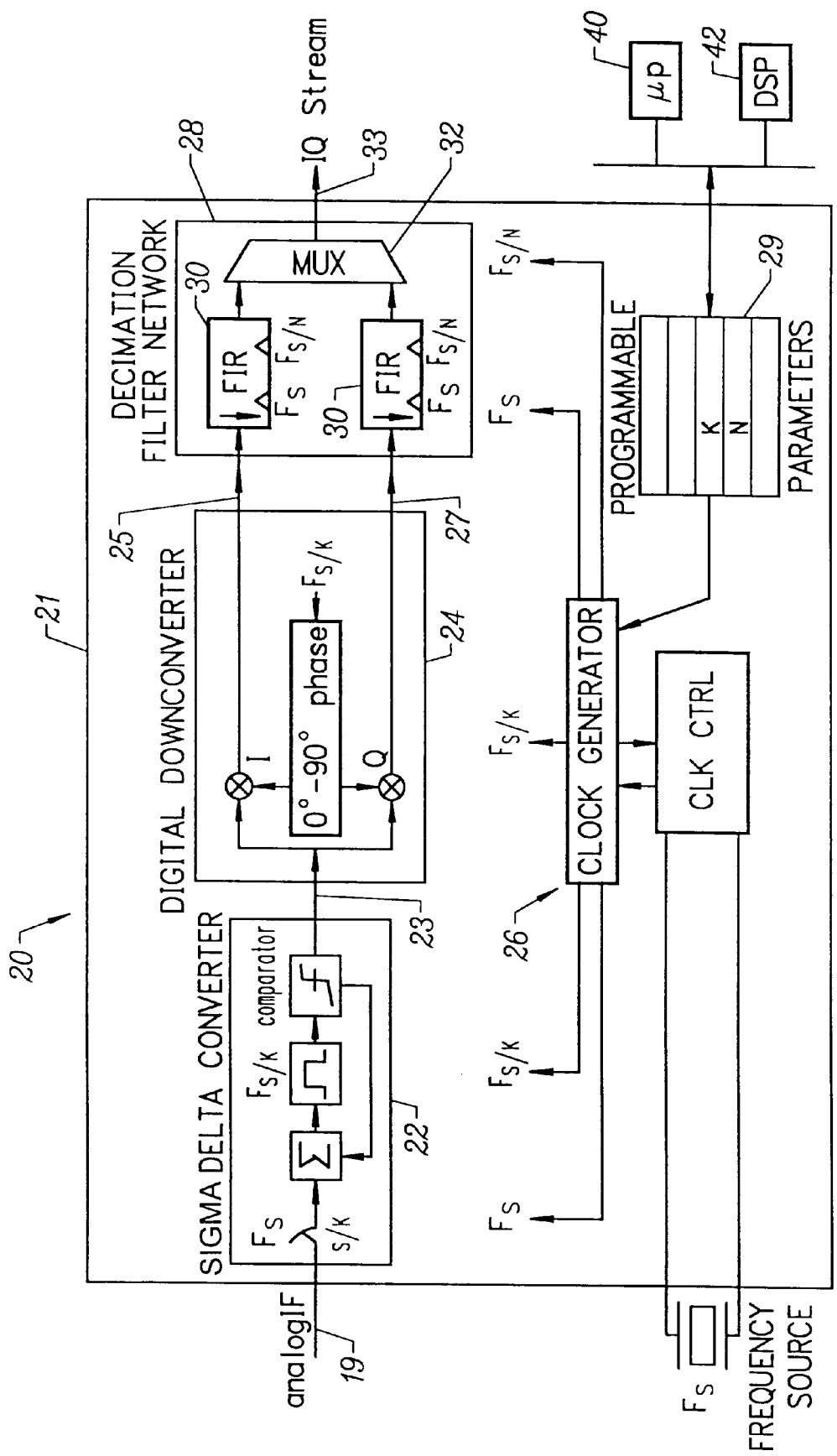
FIG. 2 illustrates a completely digital intermediate frequency receiver in accordance with an embodiment of the invention.

FIG. 2 illustrates the intermediate frequency (IF) Receiver 20 of the present invention. IF Receiver 20 includes Sigma-Delta Converter 22, digital Down-Converter 24, Clock Generator 26, Decimation Filter Network 28 and programmable Memory 29. Unlike prior art Receiver 10, IF Receiver 20 is programmable and can accommodate different intermediate, sampling and down conversion frequencies. IF Receiver 20 further differs from prior art Receiver 10 in that it is realized as a monolithic CMOS device on Substrate 21.

B. The Sigma-Delta Converter

Sigma-Delta Converter 22 takes the input analog IF signal on line 19 and digitizes it to produce an output binary digital word on line 23, which is coupled to digital Down-Converter 24. Sigma-delta converters have not been used as A/D Converters in IF Transceivers because their range of operation has been limited to the audio range. However, as VLSI technology improves the frequency range of sigma-delta converters is extending beyond the audio range, making their use in IF Transceivers feasible.

Performing A/D conversion using Sigma-Delta Converter 22 offers at least two advantages. First, Sigma-Delta Converter 22 may be realized using a standard digital CMOS process, as may be digital Down-Converter 24, Clock Generator 26, Decimation Filter Network 28 and programmable Memory 29. This permits a single chip implementation of IF Receiver 20. Second, as compared to a Flash Converter, Sigma-Delta Converter 22 offers greater quantization resolution; e.g. 16 bits resolution compared to 8 bits resolution.

Referring still to FIG. 2, other input signals to Sigma-Delta Converter 22 include two clock signals, a sample clock signal having a frequency $F_s$ and a second clock signal having a frequency $F_s/k$. Frequencies $F_s$ and $F_s/k$ are programmable, allowing Receiver 20 to accommodate a range of IF frequencies. Adjustment of these frequencies will be discussed below with respect to Clock Generator 26. The most efficient implementation of Sigma-Delta Converter 22 is arrived at for k=4, where Nyquist bandpass sampling assures that the correct sampled-data spectrum is selected in the digital domain.

Sigma-Delta Converter 22 may be realized using any one of prior art techniques. By way of example, the invention may be implemented with one of the sigma-delta modulators described by James C. Candy and Gabor C. Temes in *Oversampling Methods for A/D and D/A Conversion* in OVERSAMPLING DELTA-SIGMA DATA CONVERTERS: THEORY, DESIGN, AND SIMULATION (1992).

C. The Receiver Down-Converter and Filter

The binary digital output of Sigma-Delta Converter 22 on line 23 is fed to a programmable digital Down-Converter 24. This input is fed to both the in-phase (I) and quadrature (Q) arms of Down-Converter 24, which multiply the input signal with a phase-shifted version of the second clock signal, whose frequency is $F_s/k$, to produce down-converted, appropriately phase-shifted IQ outputs on lines 25 and 27.

Each of the digital output signals from Down-Converter 24 is then fed into digital Decimation Filter Network 28, which removes band quantization noise. Decimation Filter Network 28 includes two finite impulse response filters (FIR Filter) 30. Each FIR Filter 30 receives an input at the rate $F_s$ and decimates it to a rate determined by a third clock signal. The third clock signal has a frequency $Fs/N_i$, where $N_i$ is a programmable parameter associated with a service i. The third clock signal is also generated by Clock Generator 26. In addition, the filter coefficients of FIR Filters 30 are also programmable, depending on characteristics of the desired channel and the out-of-band noise spectrum. These coefficients can be represented as canonic-signed-digits for efficient VLSI implementation. The outputs of FIR Filters 30 are then fed into Multiplexer 32. Multiplexer 32 alternately switches its input between the I and Q channels, to produce a baseband IQ bitstream on line 33 that is fed into a signal detection processor (not illustrated).

D. The Clock Generator and Programmable Memory

Clock Generator 26 generates the clock signals necessary to IF Receiver 20 in conjunction with programmable Memory 29. These clock signals include the first clock signal, which has a frequency $F_s$, the second clock signal, which has a frequency $F_s/k$, and the third clock signal which a frequency of $F_s/N$. The frequency of all three clock signals can be adjusted, allowing IF Receiver 20 to accommodate a range of IF frequencies, rather than a single fixed frequency. The value of $F_s$ is controlled via a crystal oscillator circuit. The value chosen for $F_s$ depends upon the intermediate frequency, $F_{IF}$, to be supported by IF Receiver 20. In general, $F_s$ should be a multiple of $F_{IF}$ and greater than the frequency Nyquist rate. Preferably, the relationship between $F_s$ and $F_{IF}$ is that of Expression (1).

$$F_s=(4F_{IF})/(2k-1); \qquad (1)$$

where k is a non-zero integer.

Figure 3:
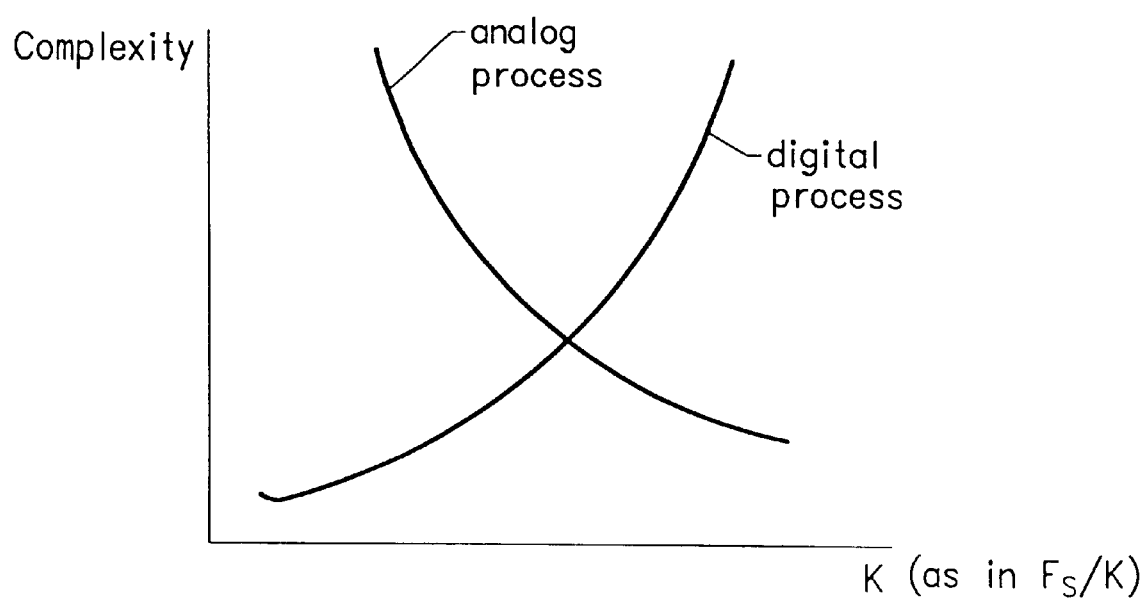
FIG. 3 illustrates the relationship between k and the complexity of the digital and analog circuitry that must be used to realize the IF Transceiver of the present invention.

The value of k chosen affects not only the value of $F_s$, it affects the type of circuitry that must be used to realize IF Receiver 20. FIG. 3 graphs the relationship between k and the complexity of the digital and analog circuitry that must be used to realize IF Receiver 20. As k increases, the complexity of the necessary digital circuitry increases, while the complexity of the necessary analog analogy circuitry decreases. Given that other factors already dictate the use of very complex digital circuitry within other circuits that might be fabricated on Substrate 21 with IF Receiver 20, the ability to use relatively simple and cheap analog circuitry prior to IF Receiver 20 is desirable. A value of k as low as 4 will permit the use of simple and cheap analog circuitry. A value representative of the chosen value k is stored in programmable Memory 29, permitting adjustment of the frequency $F_s/k$ of the second clock signal.

The frequency of the third clock signal, $F_s/N_i$, is referred to as a symbol rate, or symbol frequency, which is denoted $F_{symboli}$. The symbol rate is dictated by the service i being processed by IF Receiver 20, with each service having a unique symbol rate. Given the chosen value of $F_s$ and the symbol rates that must be supported, the necessary values of $N_i$ can be determined and programmed into programmable Memory 29 using Expression (2).

$$N_i=F_s/F_{symboli}; \qquad (2)$$

where i is an integer.

Given a value of 1 for k and standard symbol rates, values of $N_i$ are on the order of 100. Values of k and $N_i$, along with FIR filter coefficient values, are stored in programmable Memory 29. Programming of Memory 29 is under the control of Microprocessor 40 and/or Digital Signal Processor (DSP) 42. Memory 29 couples signals representative of the values of k and $N_i$ to Clock Generator 26.

E. A Monolithic CMOS IF Transmitter

Figure 4:
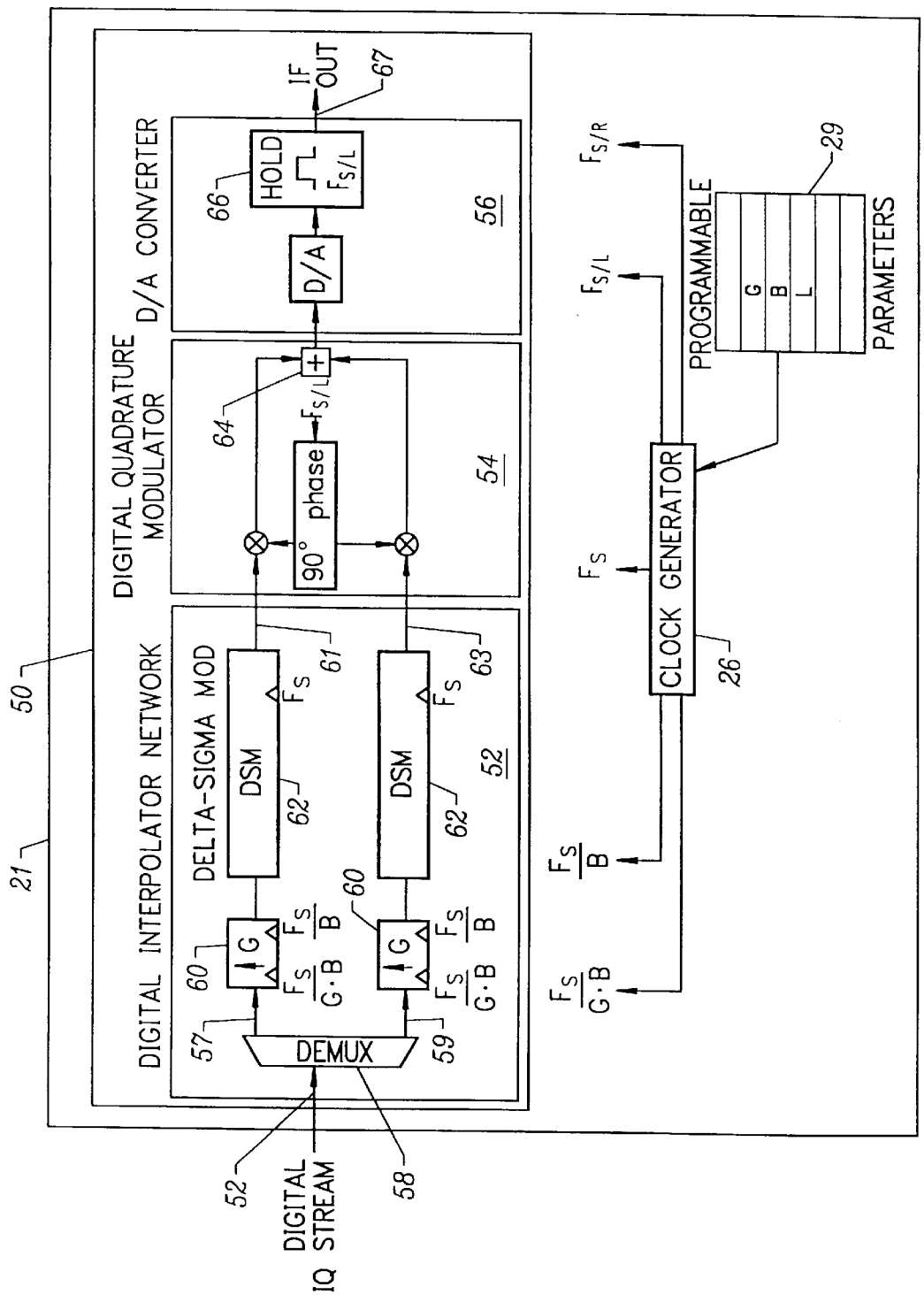
FIG. 4 illustrates a completely digital intermediate frequency transmit processor in accordance with an embodiment of the invention.

FIG. 4 illustrates a completely digital, programmable IF Transmitter 50 in accordance with an embodiment of the invention. IF Transmitter 50 is fabricated on Substrate 21, using a single CMOS process, and includes digital Interpolator Network 52, digital quadrature Modulator 54, and digital-to-analog converter (D/A) 56. Unlike prior art transmitter 100, IF Transmitter 50 digitally up converts the baseband I and Q signals, thus permitting the remaining transmission functions to be performed digitally and to be implemented as a monolithic CMOS device. The digital implementation of IF Transmitter 50 enables modification of frequency values without redesign.

The input digital I and Q signals on line 51 are passed to Demultiplexer 58 which separates them into in-phase and quadrature (IQ) digital streams on lines 57 and 59. Each stream is then fed into an Interpolator 60, which uses a factor G for interpolation. Again, using Nyquist bandpass sampling theory and G=4 leads to an extremely efficient implementation. Digital interpolation can be achieved using efficient $\sin(x)/x$ filtering, or efficient trigonometric approximations. Interpolators 60 perform their function using two clock signals received from Clock Generator 26, one clock signal with a frequency of $F_s/B$ and the other with a frequency of $F_s/(G*B)$. Like G, B is a programmable parameter. The output of each Interpolator 60 is then fed into a Delta-Sigma Modulator 62, which uses a clock signal having a frequency of $F_s$ to produce digital output signals on lines 61 and 63. Delta-Sigma Modulators 62 may be realized using modulators of the type described in James C. Candy and Gabor C. Temes in *Oversampling Methods for A/D and D/A Conversion* in OVERSAMPLING DELTA-SIGMA DATA CONVERTERS: THEORY, DESIGN, AND SIMULATION (1992).

Modulator 54 receives as inputs the signals on lines 61 and 63 and couples them to an I-channel Mixer and a Q-channel Mixer. Modulator 54 mixes its input signals up using a phase-shifted version of a sixth clock signal, which has a frequency of $F_s/L$. L is a programmable parameter. Summer 64 sums the outputs of the I-channel Mixer and the Q-channel Mixer, and the resulting digital word is fed into D/A 56. D/A 56 uses a Sample-and-Hold circuit 66, operating at a rate of $F_s/2$, before passing through a low-cost analog IF reconstruction filter. The resulting output is an IF signal on line 67.

The clock signals used by IF Transmitter 50 are generated by Clock Generator 26 in conjunction with programmable Memory 29. These include a fourth clock signal having a frequency of $F_s/B$, a fifth clock signal having a frequency of $F_s/(G*B)$, a sixth clock signal having a frequency of $F_s/L$, and a seventh clock signal having a frequency of $F_s/2$. As discussed previously, the value of the $F_s$ frequency is controlled via a crystal oscillator circuit. The value chosen for $F_s$ depends upon the intermediate frequency, $F_{IF}$, to be supported by IF Receiver is controlled via a crystal oscillator circuit (not illustrated). Because the $F_s$ clock signal will be used to clock the over-sampling Delta-Sigma Modulators 60 the value chosen for $F_s$ should be should be a multiple of $F_{IF}$ and greater than the frequency Nyquist rate. Preferably, $F_s = F_{IF}$.

The frequency of the fourth clock signal depends upon the value of B, where B represents the bandwidth of the output signal on line 67. A value representative of the chosen value B is stored in programmable Memory 29, permitting adjustment of the frequency $F_s/B$ of the fourth clock signal.

The parameter $G_i$ controls the value of the frequency of the fifth clock signal, $F_s/(G_i*B)$, which represent a symbol rate, $F_{symboli}$. Each service i supported by IF Transmitter 50 has an associated $F_{symboli}$. Thus, appropriate values for parameters $G_i$ can be determined using the relationship of Expression (3).

$$G_i = F_s/(F_{symboli}*B). \tag{3}$$

Typically, values of $G_i$ are chosen to be within a range of 64–128. Values representative of the chosen value $G_i$ are stored in programmable Memory 29, permitting adjustment of the frequency of the fifth clock signal.

The parameter L controls the values of the frequency of the sixth clock signal, $F_s/L$, which is used by Sample-and-Hold circuit 66. While there are no constraints on the value of L on the transmission end, design of the associated receiver is simplified by large values. Thus, preferable values of L are on the order of 24–36. A value representative of the chosen value L is stored in programmable Memory 29, permitting adjustment of the frequency of the sixth clock signal.

Programming of Memory 29 is under the control of a Microprocessor 40 and/or Digital Signal Processor (DSP) 42 (FIG. 2). Memory 29 couples signals representative of the values of B, $G_i$, and L to Clock Generator 26.

E. A Monolithic CMOS IF Transceiver

Figure 5:
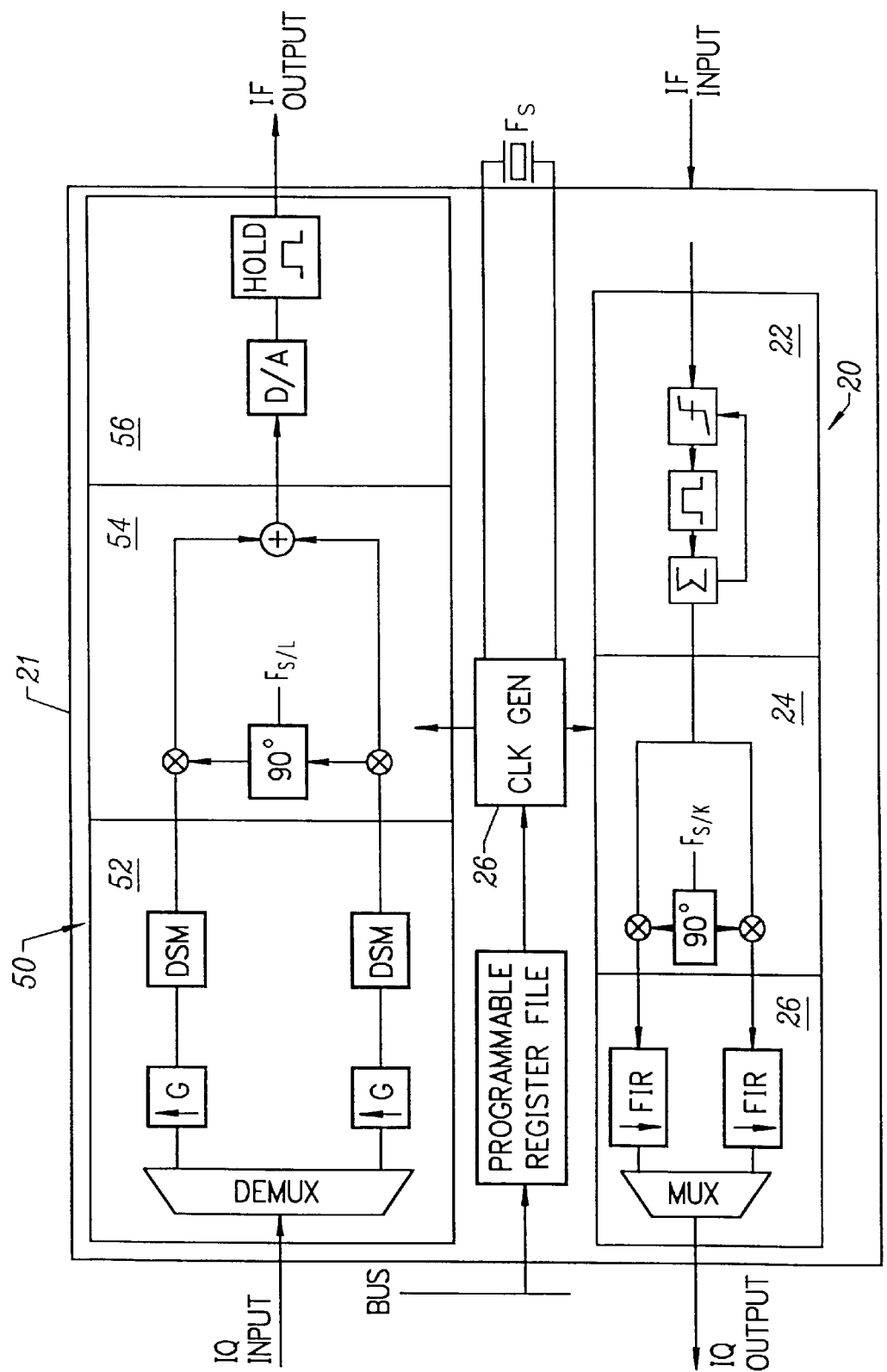
FIG. 5 illustrates a completely digital intermediate frequency transceiver in accordance with an embodiment of the invention.
Figure 6:
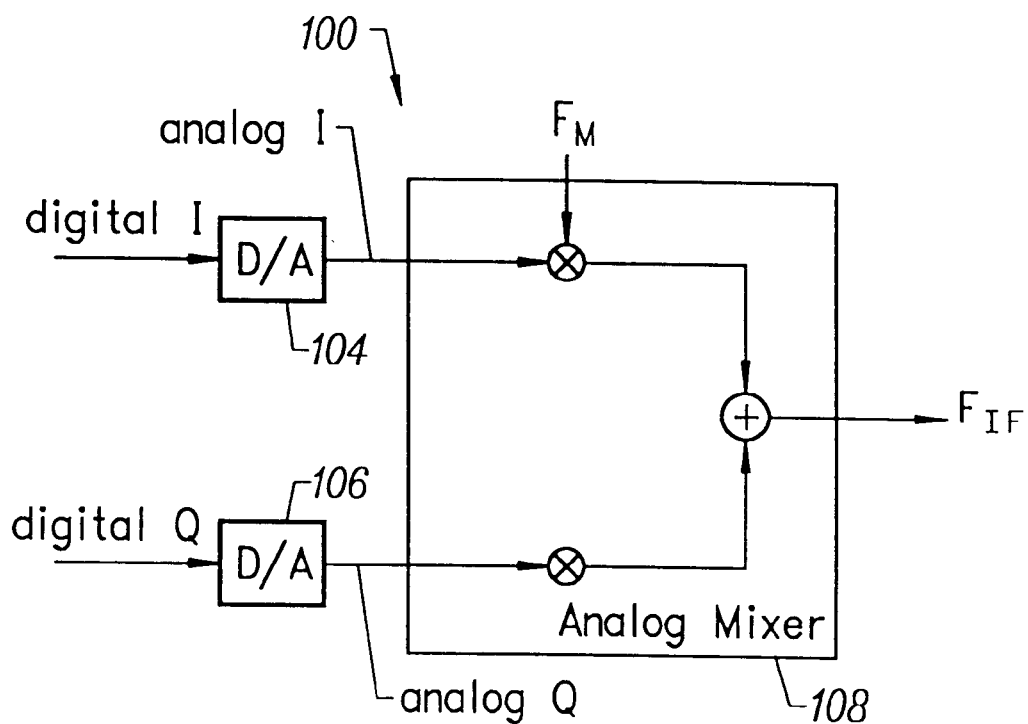
FIG. 6 illustrates a prior art intermediate frequency transmitter.

FIG. 5 illustrates a completely digital, programmable monolithic CMOS IF Transceiver in accordance with the present invention, which combines the previously described IF Receiver 20 and IF Transmitter 50.

F. Summary

Those skilled in the art will appreciate that the invention provides a parameterizable and programmable architecture for intermediate frequency signal processing. The completely digital architecture achieves intermediate frequency up-conversion and down-conversion. A combination sigma-delta architecture and polyphase filter is used to achieve the up-conversion and down-conversion.

The invention allows the replacement of expensive analog components with lower-cost CMOS digital circuits. The invention facilitates the use of a single architecture across a wide variety of intermediate frequencies and channel bandwidths. The completely digital path ensures a linear transmit and receive path.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A CMOS programmable digital intermediate frequency receiver, comprising:
   a programmable memory receiving and storing a first value representative of a programmable parameter k and a second value representative of programmable parameter N;
   a clock generator coupled to the programmable memory, the clock generator generating a first clock signal having a first frequency, $f_I$, a second clock signal having a second frequency approximately equal to $f_I/k$, and a third clock signal having a third frequency approximately equal to $f_I/N$;
   a sigma delta converter sampling an analog input signal having an intermediate frequency using the first clock signal to generate a first set of digital signals;
   a digital downconverter mixing down the first set of digital signals using the second clock signal to generate a second set of digital signals; and
   a decimation filter network filtering the second set of digital signals using the third clock signal to generate a third set of digital signals.

2. A monolithic CMOS programmable digital intermediate frequency transceiver, comprising:
   a programmable memory receiving and storing a first value, a second value, a third value, a fourth value and a fifth value, the first value being representative of a programmable parameter k, the second value representative of programmable parameter N, the third value being representative of a programmable parameter G, the fourth value being representative of a programmable parameter B, the fifth value being representative of a programmable parameter L;
   a clock generator coupled to the programmable memory, the clock generator generating first, second, third, fourth, fifth and sixth clock signals, the first clock signal having a first frequency, $f_I$, the second clock signal having a second frequency approximately equal to $f_I/k$, the third clock signal having a third frequency approximately equal to $f_I/N$, the fourth clock signal having a fourth frequency approximately equal to $f_I/B$, the fifth clock signal having a fifth frequency approximately equal to $f_I/GB$, and the sixth clock signal having a sixth frequency approximately equal to $f_I/L$;
   a receiver receiving an analog input signal having a first intermediate frequency, the receiver comprising:
      a sigma delta converter sampling the analog input signal using the first clock signal to generate a first set of digital signals;
      a digital downconverter mixing down the first set of digital signals using the second clock signal to generate a second set of digital signals;
      a decimation filter network filtering the second set of digital signals using the third clock signal to generate a third set of digital signals;
   a transmitter transmitting an analog output signal having a second intermediate frequency, the transmitter comprising:
      a digital interpolator network interpolating a fourth set of digital signals using the fourth and fifth clock signals to generate a fifth set of digital signals;
      a digital quadrature modulator mixing up the fifth set of digital signals using the sixth clock signal to generate a sixth set of digital signals; and
      a digital-to-analog converter converting the sixth set of digital signals into the analog output signal.

3. A method of receiving an analog input signal having an intermediate frequency using a CMOS programmable digital intermediate frequency receiver, the method comprising:
   receiving and storing a first value representative of a programmable parameter k and a second value representative of programmable parameter N;
   generating a first clock signal having a first frequency, $f_I$, a second clock signal having a second frequency approximately equal to $f_I/k$, and a third clock signal having a third frequency approximately equal to $f_I/N$;
   sampling the analog input signal having an intermediate frequency using a sigma delta converter and the first clock signal to generate a first set of digital signals;
   mixing down the first set of digital signals using the second clock signal to generate a second set of digital signals; and
   filtering the second set of digital signals using the third clock signal to generate a third set of digital signals.

4. A method of receiving and transmitting analog IF signals using a monolithic CMOS programmable digital intermediate frequency transceiver, the method comprising:
   receiving and storing a first value, a second value, a third value, a fourth value and a fifth value, the first value being representative of a programmable parameter k, the second value representative of programmable parameter N, the third value being representative of a programmable parameter G, the fourth value being representative of a programmable parameter B, the fifth value being representative of a programmable parameter L;
   generating first, second, third, fourth, fifth and sixth clock signals, the first clock signal having a first frequency, $f_I$, the second clock signal having a second frequency approximately equal to $f_I/k$, the third clock signal having a third frequency approximately equal to $f_I/N$, the fourth clock signal having a fourth frequency approximately equal to $f_I/B$, the fifth clock signal having a fifth frequency approximately equal to $f_I/GB$, and the sixth clock signal having a sixth frequency approximately equal to $f_I/L$;
   sampling an analog input signal having a first IF frequency using a sigma delta converter and the first clock signal to generate a first set of digital signals;
   mixing down the first set of digital signals using the second clock signal to generate a second set of digital signals;
   filtering the second set of digital signals using the third clock signal to generate a third set of digital signals;
   interpolating a fourth set of digital signals using the fourth and fifth clock signals to generate a fifth set of digital signals;
   mixing up the fifth set of digital signals using the sixth clock signal to generate a sixth set of digital signals; and
   converting the sixth set of digital signals into an analog output signal having a second IF frequency.

5. A monolithic CMOS programmable digital intermediate frequency transmitter, comprising:
   a programmable memory receiving and storing a first value, a second value, and a third value, the first value being representative of a programmable parameter G, the second value being representative of a programmable parameter B, the third value being representative of a programmable parameter L;
   a clock generator coupled to the programmable memory, the clock generator generating first, second, and third clock signals, the first clock signal having a first frequency approximately equal to $f_l/B$, the second clock signal having a second frequency approximately equal to $f_l/GB$, and the third clock signal having a third frequency approximately equal to $f_l/L$;

a digital interpolator network interpolating a first set of digital signals using the first and second clock signals to generate a second set of digital signals;

a digital quadrature modulator mixing up the second set of digital signals using the third clock signal to generate a third set of digital signals; and a digital-to-analog converter converting the third set of digital signals into an analog output signal.

\* \* \* \* \*